United States Patent
Park

(10) Patent No.: US 11,081,201 B2
(45) Date of Patent: Aug. 3, 2021

(54) PARALLEL TEST DEVICE

(71) Applicant: Winbond Electronics Corp., Taichung (TW)

(72) Inventor: Chan-Seok Park, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/695,203

(22) Filed: Nov. 26, 2019

(65) Prior Publication Data

US 2021/0158883 A1  May 27, 2021

(51) Int. Cl.
*G11C 29/14* (2006.01)
*G11C 29/12* (2006.01)

(52) U.S. Cl.
CPC .......... *G11C 29/14* (2013.01); *G11C 29/1201* (2013.01); *G11C 29/12015* (2013.01)

(58) Field of Classification Search
CPC ............... G11C 29/14; G11C 29/1201; G11C 29/12015
See application file for complete search history.

(56) References Cited

U.S. PATENT DOCUMENTS

| | | | |
|---|---|---|---|
| 9,423,456 B2* | 8/2016 | Kim | G01R 31/31716 |
| 9,638,751 B2 | 5/2017 | Kim | |
| 9,997,256 B2 | 6/2018 | Lee | |
| 2006/0048023 A1 | 3/2006 | Hobara | |
| 2007/0088993 A1* | 4/2007 | Baker | G11C 29/48 714/718 |
| 2010/0327877 A1* | 12/2010 | Kang | G06K 7/0008 324/537 |
| 2011/0234381 A1* | 9/2011 | Kang | G11C 29/12 340/10.4 |
| 2012/0155203 A1 | 6/2012 | Hwang et al. | |
| 2015/0012791 A1* | 1/2015 | Kim | G11C 29/36 714/744 |
| 2017/0062039 A1* | 3/2017 | Ong | G11C 29/46 |

FOREIGN PATENT DOCUMENTS

| | | |
|---|---|---|
| CN | 101060008 | 10/2007 |
| TW | I550623 | 9/2016 |

OTHER PUBLICATIONS

"Office Action of Taiwan Counterpart Application", dated May 5, 2021, p. 1-p. 7.

* cited by examiner

*Primary Examiner* — Kyle Vallecillo
(74) *Attorney, Agent, or Firm* — JCIPRNET

(57) ABSTRACT

A parallel test device is provided. The parallel test device of the disclosure includes an I/O pad, a plurality of input buffers, and a plurality of output drivers. The I/O pad is configured to perform input/output operations in the parallel test device. The input buffers are configured to enable write data. The output drivers are configured to enable read data and output the read data to the I/O pad. A test signal corresponds to the data from an external device is transferred to the output drivers through the I/O pad in the parallel test device during a test mode.

13 Claims, 3 Drawing Sheets

PARALLEL TEST DEVICE

BACKGROUND OF THE INVENTION

Technical Field

The present disclosure relates to a parallel test device, and more particularly relates to a parallel test in a memory device to activate an unused part during a test mode in the memory device.

Description of Related Art

Nowadays, in typical DRAM (Dynamic Random Access Memory) and NAND memory device a test device is configured to verify the characteristics and functions of the memory device. In order to test the large number of memory device, there is a need to test all the memory device using a channel allocated test. Therefore, a parallel test device is employed which serves as a self-testing device to determine the memory device is failure or not. However, during testing, the parallel test device needs to write the same data into a plurality of I/O (Input/Output) lines using a single I/O line during data compression. Owing to using the single I/O line, it is not possible for the parallel test device to determine one or more failed parts in the memory device. In some parallel test device, a test controller is employed internally in the parallel test device to address the data written into the plurality of I/O lines using the single I/O line but an output driver in the parallel test device is critical to a data valid window. Due to a data setup/hold time is smaller than the data valid window, an unused part including an I/O buffer degrades the performance even there is a minor failure in the memory device.

Along with requirement of overcoming detection of failure in the memory device due to critical data valid window in the parallel test device, it could be desirable to develop a parallel test device with improved failure detection for certain applications in this field.

SUMMARY OF THE INVENTION

The disclosure provides a parallel test device that receives a test signal from an external device.

A parallel test device of the disclosure includes an I/O pad, a plurality of input buffers, and a plurality of output drivers. The I/O pad is configured to perform input/output operations in the parallel test device. The input buffers are configured to enable write data. The output drivers are configured to enable read data and output the read data to the I/O pad. A test signal corresponds to the data from an external device is transferred to the output drivers through the I/O pad in the parallel test device during a test mode.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

It is to be understood that other embodiment may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
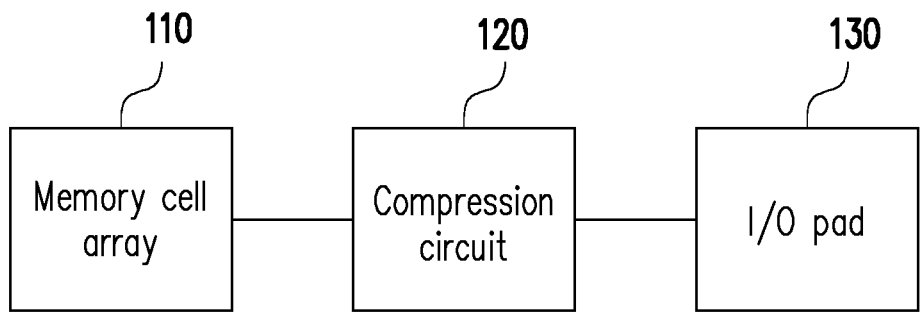
FIG. 1 illustrates a block diagram of a parallel test device according to an exemplary embodiment of the disclosure.
Figure 2:
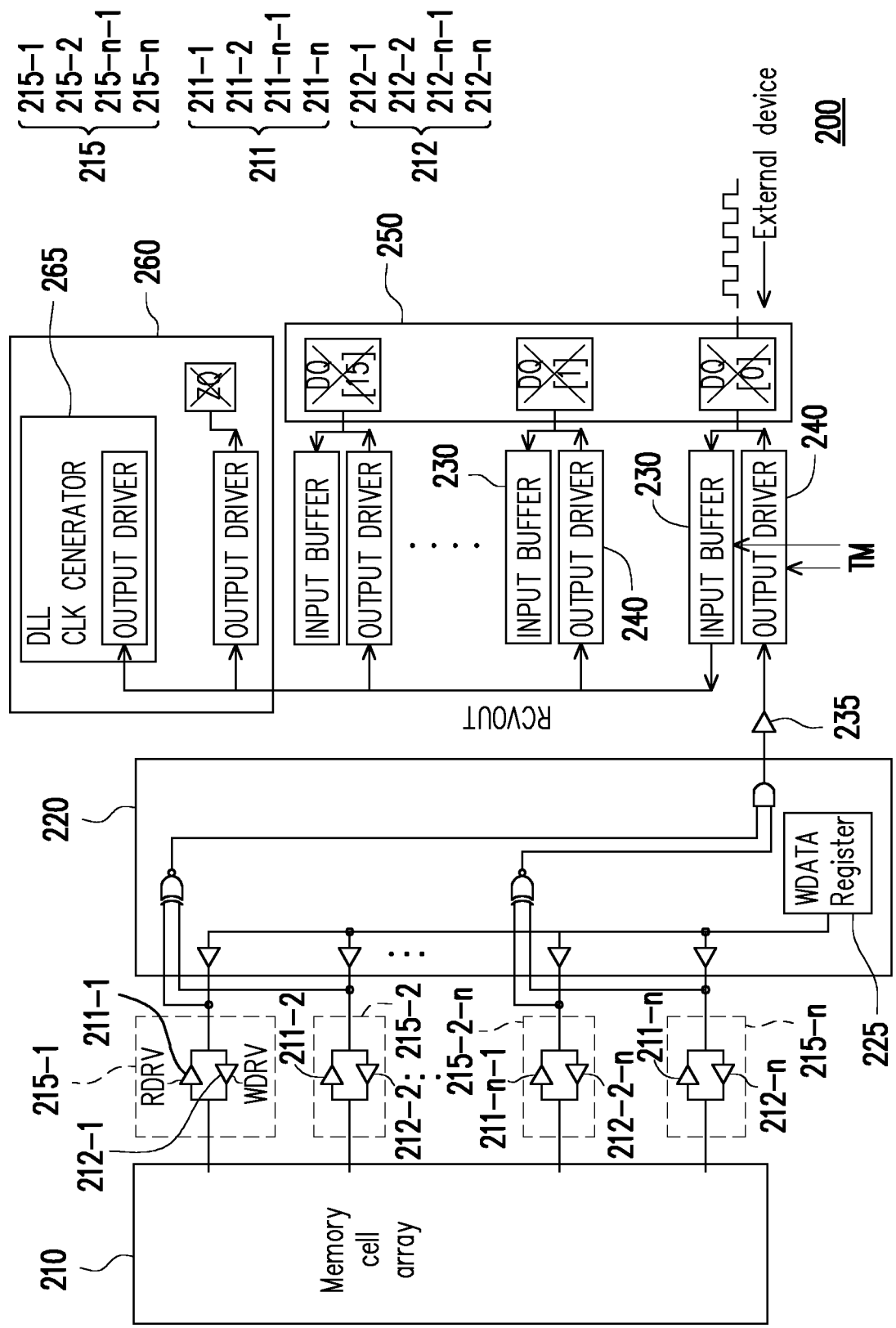
FIG. 2 illustrates a schematic diagram of a parallel test device according to an exemplary embodiment of the disclosure.

FIG. 1 illustrates a block diagram of a parallel test device according to an exemplary embodiment of the disclosure. FIG. 2 is a schematic diagram illustrating a parallel test device according to an exemplary embodiment of the disclosure. The parallel test device 100 includes memory cell array 110, a compression circuit 120, and an I/O pad 130 of FIG. 1.

The parallel test device 200 includes a memory cell array 210, a read/write driver 215, a compression circuit 220, a plurality of input buffers 230, a plurality of output drivers 240, an I/O pad 250, and a calibration device 260. Same elements in FIG. 2 have a same reference numbers as the parallel test device 100 in FIG. 1.

With reference to FIG. 1 and FIG. 2, a memory cell array 210 includes a plurality of memory cells, typically 8 to 64 arrays in each memory cells.

The compression circuit 220 is configured to compress data from the memory cell array 210 during a data compression to generate a compressed data. The compression unit 220 may be coupled to a plurality of read drivers (is also known as RDRV) 211, a plurality of write drivers (is also known as WDRV) 212, and an output buffer 235. In other words, the compression circuit 220 may compress the data from the memory cell array 210 and output the compressed data to the output buffer 235. During the data compression, the same data may be written into the write drivers 212 through a write data register (is also known as WDATA register) 225.

In detail, the RDRV 211 and the WDRV 212 to form the read/write (is also known as R/W) driver 215. The read/write driver 215 is configured to perform a read/write operation in the memory cell array 210. To be specific, the RDRV 211 is configured to drive a read data from the memory cell array 210. Similarly, the WDRV 212 is configured to drive a write data from the memory cell array 210.

It is noted that, a read driver 211-1 and a write driver 212-1 forms a first driver 215-1. Similarly, a read driver 211-2 and a write driver 212-2 forms a second driver 215-2. On the other hand, a read driver 211-$n$ and a write driver 212-$n$ forms an nth driver 215-$n$, where n is a natural number.

The input buffers 230 and the output drivers 240 are coupled between the compression circuit 220 and the I/O pad 250. The input buffers 230 are configured to enable write data. In other words, the input buffers 230 are configured to buffer data received from the I/O pad 250 and output the buffered data.

During a read operation in a normal mode, the output drivers 240 are configured to enable the read data and output the read data to the I/O pad 250. The input buffers 230 may not operate during the normal mode. On the other hand, during a write operation in the normal mode, the input buffers 230 receives the write data from the I/O pad 250, and the output drivers 240 may not operate.

On contrary, during a test mode, a test signal RCVOUT corresponding to the data from an external device is transferred to the output drivers 240 through the I/O pad 250 in response to the test mode enable signal TM. It is noted that during the test mode, the test signal RCVOUT corresponding to the data from the external device is not transferred to the input buffers 230.

In this embodiment, the data generated from the external device is a toggling pattern. To be specific, the data is a square pulse.

In some embodiments, the data generated from the external device is a pulse with different periods, thus the type of a data pattern generated from the external device is not limited in this disclosure, thereby increasing the flexibility in the parallel test device 200.

The I/O pad 250 is coupled to the output drivers 240 and the input drivers 230. The I/O pad 250 is sub-divided into a plurality of I/O pad units (DQ[0]~DQ[15]). The compressed data from the compression circuit 220 is transferred to one pad DQ[0]. For example, the I/O pad DQ[0] is an used pad and the remaining pad units DQ[1]~DQ[15] may be an unused pads. In other words, DQ[0] is a data pad in this embodiment.

It is noted that any pad in the parallel test device 200 may be chosen to be a data pad during the test mode.

For an example, a memory device such as DRAM, NAND flash memories may be configured to compress the data during the test mode. It is noted that, a dedicated data pad such as DQ[0] among the plurality of I/O pad units may be used during the test mode and the remaining I/O pad units DQ[1]~DQ[15] are unused I/O pad units and are stressed during the test mode.

The calibration device 220 includes a delay-locked loop (DLL) clock generator 265. The calibration device 260 is configured to generate a calibration scheme through the I/O pad ZQ to tune the output drivers 240. The I/O pad ZQ is used during the test mode to provide the calibration scheme to the parallel test device 200. The DLL clock generator 265 is configured to generate an internal clock to the parallel test device 200 during the test mode.

Based on the above, the test signal RCVOUT corresponding to the data from the external device not from the internal circuit. By using the test signal RCVOUT from the external device any kind of test pattern may be implemented thereby enhancing the flexibility of the parallel test device. The calibration device is included to provide an additional driver strength to the parallel test device.

Figure 3:
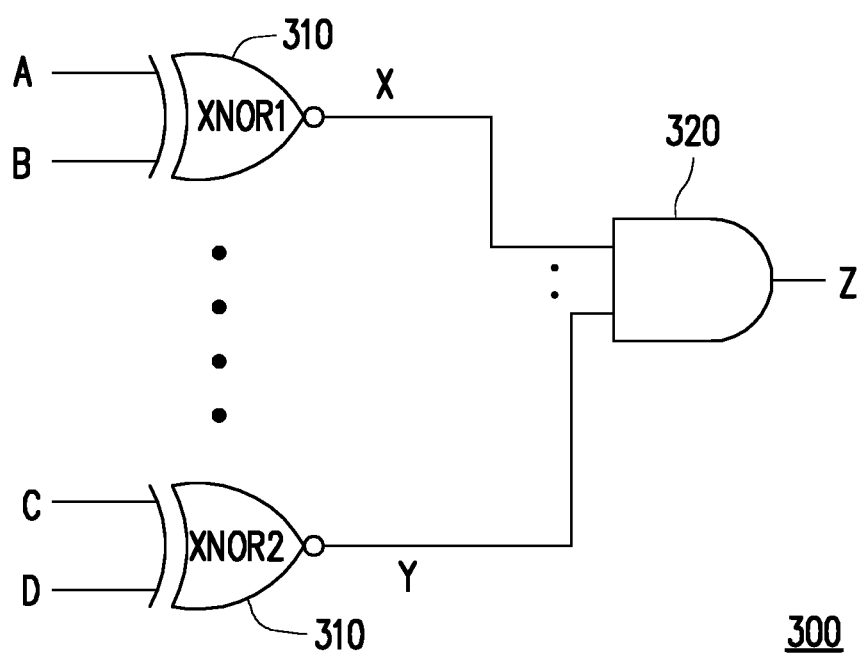
FIG. 3 illustrates a schematic diagram of a compression circuit according to an exemplary embodiment of the disclosure.

FIG. 3 illustrates a schematic diagram of a compression circuit according to an exemplary embodiment of the disclosure. The compression circuit 300 includes a plurality of exclusive NOR gates (XNOR1, XNOR2) 310 and an AND gate 320.

With reference to FIG. 2, the compression circuit 300 is configured to compress data from the memory cell array 210. The compression circuit 300 may be coupled to a plurality of read drivers (is also known as RDRV) 211, a plurality of write drivers (is also known as WDRV) 212, and an output buffer 235. In other words, the compression circuit 220 may compress the data from the memory cell array 210 and output the compressed data to the output buffer 235. During data compression, the same data may be written into the WDRV 212 through write data register (is also known as WDATA register) 225.

In this embodiment, the XNOR gates 310 is a 2-input XNOR gates.

With reference to FIG. 2, the XNOR 1 may perform exclusive XNOR operation on the output from the first driver 215-1 and the output from the second driver 215-2 and generates a first compressed output X. In other words, the output of the first driver is A and the output of the second driver is B and generates the first compressed output X.

Similarly, the XNOR 2 may perform exclusive XNOR operation on the output from the $(n-1)^{th}$ driver 215-$n$-1 and the output from the nth driver 215-$n$ and generates a second compressed output Y. In detail, the output of the n−1th driver is C and the output of the nth driver is D and generates a second compressed output Y.

In some embodiments, the XNOR gates is n-input, where n is a natural number, thus the number of inputs in the XNOR gates 310 is not limited in this disclosure.

After obtains the first compressed output X and the second compressed output Y, the AND gate 320 is configured to perform a summing operation to provide a sum of compressed output data Z.

In this embodiment, the AND gate 320 is a 2-input AND gate.

In some embodiments, the AND gate 320 is an n-input AND gate, the value of n is based on the number of compressed outputs.

In summary of the embodiments in the disclosure, by using the test signal from the external device any kind of test pattern may be implemented thereby enhancing the flexibility of the parallel test device. The calibration device is included to provide an additional driver strength to the parallel test device. In addition, based on the test signal provided from the external device all the unused pads are stressed to detect the failure in the parallel test device during the test mode.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A parallel test device comprising:
    an I/O pad, configured to perform input/output operations in the parallel test device;
    a plurality of input buffers, configured to enable write data; and
    a plurality of output drivers, configured to enable read data and output the read data to the I/O pad;
    wherein a test signal corresponding to a data from an external device is transferred to the output drivers through the I/O pad in the parallel test device during a test mode.

2. The parallel test device of claim 1, further comprising:
    a compression circuit, configured to compress data from a memory cell array of the parallel test device during a data compression to generate a compressed data.

3. The parallel test device of claim 2, further comprising:
    an output buffer, configured to receive the compressed data from the compression circuit.

4. The parallel test device of claim 2, wherein during the data compression, the same data is written into a plurality of write drivers through a write data register.

5. The parallel test device of claim 2, the compression circuit further comprises:
   a plurality of exclusive NOR gates; and
   an AND gate.

6. The parallel test device of claim 1, wherein the test signal corresponding to the data from the external device is not transferred to the input buffers during the test mode.

7. The parallel test device of claim 1, wherein the data from the external device is a toggling pattern.

8. The parallel test device of claim 1, further comprising:
   a calibration device, configured to generate a calibration scheme to tune the output drivers.

9. The parallel test device of claim 8, further comprising:
   a delay-locked loop clock generator, configured to generate an internal clock to the parallel test device during the test mode.

10. The parallel test device of claim 1, further comprising:
    a plurality of read drivers, configured to drive the read data from a memory cell array; and
    a plurality of write drivers, configured to drive the write data from the memory cell array.

11. The parallel test device of claim 1, wherein during the test mode, the test signal corresponding to the data from the external device is transferred to the output drivers through the I/O pad in response to a test mode enable signal.

12. The parallel test device of claim 1, wherein the I/O pad is subdivided into a plurality of I/O pad units.

13. The parallel test device of claim 12, wherein the I/O pad comprises a data pad that is used during the test mode and the other I/O pad units are unused during the test mode.

* * * * *